(12) United States Patent
Wen et al.

(10) Patent No.: US 6,716,681 B2
(45) Date of Patent: Apr. 6, 2004

(54) METHOD FOR MANUFACTURING THIN FILM TRANSISTOR PANEL

(75) Inventors: Chun Bin Wen, Tainan (TW); Chin Lung Ting, Tainan (TW)

(73) Assignee: Chi Mei Optoelectronics Corp., Tainan (TW)

( * ) Notice: Subject to any disclaimer, the term of this patent is extended or adjusted under 35 U.S.C. 154(b) by 0 days.

(21) Appl. No.: 10/106,493

(22) Filed: Mar. 27, 2002

(65) Prior Publication Data

US 2003/0186488 A1 Oct. 2, 2003

(51) Int. Cl.⁷ .................... H01L 21/00; H01L 21/84
(52) U.S. Cl. ................ 438/149; 438/158; 438/164
(58) Field of Search .................. 438/149, 158, 438/163, 164

(56) References Cited

U.S. PATENT DOCUMENTS

| | | | |
|---|---|---|---|
| 5,362,660 A | * 11/1994 | Kwasnick et al. | 438/158 |
| 5,500,380 A | * 3/1996 | Kim | 438/158 |
| 5,532,180 A | * 7/1996 | den Boer et al. | 438/30 |
| 5,721,164 A | * 2/1998 | Wu | 438/159 |
| 6,284,576 B1 | * 9/2001 | Ban et al. | 438/149 |
| 6,461,886 B1 | * 10/2002 | Uehara et al. | 438/30 |
| 6,504,175 B1 | * 1/2003 | Mei et al. | 257/66 |

OTHER PUBLICATIONS

Yamazak et al. US patent application Publication US 20020043662A1.*
Lee US patent application Publication US 20010012648A1.*
Wolf and Tauber; "Silicon Processing for the VLSI Era vol. 1: Process Technology"; pp. 198, 210, 211, 218 and 219; Lattice Press 1986; Sunset Beach, CA.*

* cited by examiner

Primary Examiner—George Fourson
Assistant Examiner—Fernando Toledo
(74) Attorney, Agent, or Firm—Lowe Hauptman Gilman & Berner LLP

(57) ABSTRACT

The present invention provides a method for manufacturing a thin film transistor panel. At first, a gate line is formed on an insulating substrate. A gate insulating layer and a semiconductor layer which comprises an impurity-doped layer are deposited over the gate line sequentially. The semiconductor layer is patterned. A conductive pattern layer with a source electrode, a channel region and a drain electrode is formed over the patterned semiconductor layer. The impurity-doped layer is exposed at the channel region. Then, the impurity-doped layer at the channel region is insulated.

4 Claims, 3 Drawing Sheets

METHOD FOR MANUFACTURING THIN FILM TRANSISTOR PANEL

BACKGROUND OF THE INVENTION

1. Field of the Invention

The present invention relates to a method for manufacturing a thin film transistor (TFT) panel.

2. Description of the Related Art

Unlike conventional monolithic transistors that are formed in the inside of a semiconductor substrate, thin-film transistors are fabricated by stacking several thin films on a substrate. Therefore, the thin-film transistors have a simple and easy-to-fabricate configuration compared with the monolithic transistors. As a result, the thin-film transistors have been in widespread use as, for example, switching elements in a large-sized electronic device such as an LCD device.

Further, the simplicity of the device configuration and fabrication method of the thin-film transistors makes it possible to fabricate various applied products at low cost, which contributes to popularization of them on the market.

In recent years, the above simplicity of the thin-film transistors has been further improved and progressed. Referring to FIG. 1, a thin-film transistor 10 includes a substrate 100, a semiconductor film 102, a source electrode 104, a drain electrode 106, a gate insulating film 108, and a gate electrode 110. The source and drain electrodes 104/106, which are located apart from each other on a same side of the semiconductor film 102, are electrically connected to the semiconductor film 102. The gate insulating film 108 is located on an opposite side of the semiconductor film 102 to the source electrode 104 and drain electrode 106. The gate electrode 110, which is located on the same side of the semiconductor film 102 as the gate insulating film 108, is opposite to the semiconductor film 102 through the gate insulating film 108. A conductive channel is formed in the gate-side surface region of the semiconductor film 102 under application of a proper gate voltage.

The semiconductor film 102 is typically formed by an undoped (or, i-type) semiconductor material. In this case, there is the need for interposing an n+ impurity semiconductor film 112 between the i-type semiconductor film 102 and the opposing source electrode 104 and drain electrode 106. The $n^+$ impurity semiconductor film 112 is used to form source and drain contact regions between the undoped semiconductor film 102 and the source electrode 104 and drain electrode 106, respectively. The source and drain contact regions provide good ohmic contacts therebetween.

When the n+ impurity semiconductor film 102 serving as the source and drain contact regions is provided, the source electrode 104 and drain electrode 106 are short-circuited to each other by the $n^+$ impurity doped semiconductor film 112 in a channel region 114, resulting in the so-called channel leakage. This channel leakage increases OFF current levels. Since low OFF current is required for display and imaging applications, this is a significant problem in devices of this kind. Therefore, it is necessary to add a back etching process to selectively remove the $n^+$ impurity semiconductor film in the channel region 114 between the source and drain electrodes 104/106. Typically, the $n^+$ semiconductor film 112 is etched by using $Cl_2/SF_6$ gases. However, the use of poisonous and corrosive material such as $Cl_2$ should become obsolete in the next decade, because of the environmental concern in these years in the world. Furthermore, $Cl_2$ is difficult to handle and is very poisonous and expensive.

The present invention therefore seeks to provide an improved method of manufacturing a TFT panel that overcomes, or at least reduces the above-mentioned problems of the prior art.

SUMMARY OF THE INVENTION

It is an object of the present invention to resolve the aforementioned channel leakage issue of the TFT panel by an insulating process without using any poisonous gas.

In the manufacturing method of a thin film transistor panel according to the present invention, a first metal pattern including at least a gate line with a gate electrode is formed on an insulating substrate such as a transparent glass substrate. Next, a gate insulating layer is deposited over the gate line. A semiconductor layer which comprises an amorphous silicon layer and an impurity-doped layer, e.g., an $n^+$ amorphous silicon layer, is formed on the gate insulating layer. After the semiconductor layer is patterned, a conductive pattern layer is formed on the patterned semiconductor layer. The conductive pattern layer includes a source electrode, a drain electrode and a channel region disposed between the source electrode and the drain electrode. The impurity-doped layer has a portion located in the channel region and exposed through the conductive pattern layer.

Thereafter, the exposed portion of the impurity-doped layer in the channel region is insulated by a process, e.g., an oxidizing process, a nitridizing process or a p+ impurity doping process. The oxidizing process may be conducted by ultraviolet (UV) radiation, atmosphere plasma, $O_2$ ashing or $O_3$ treatment.

In the manufacturing method of a thin film transistor panel according to the present invention, the insulating step described above significantly reduces the conductivity of the exposed portion of the impurity doped layer. Therefore, the electrons in the impurity-doped layer between the source and drain electrodes can hardly be mobilized thereby overcoming or, at least, reducing the channel leakage problems. Furthermore, since no poisonous gas is involved in the aforementioned insulating step, the insulating step of the present invention can be achieved by a simple apparatus with low cost in comparison with the conventional back etching process using $Cl_2/SF_6$ gases.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
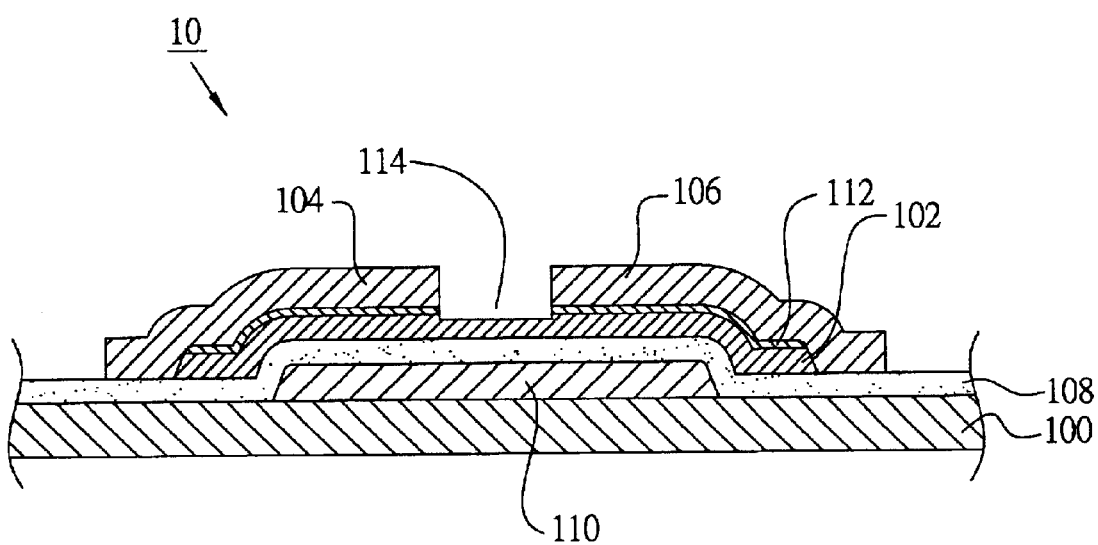
FIG. 1 is a cross-sectional view of a conventional thin film transistor.
Figure 2A:
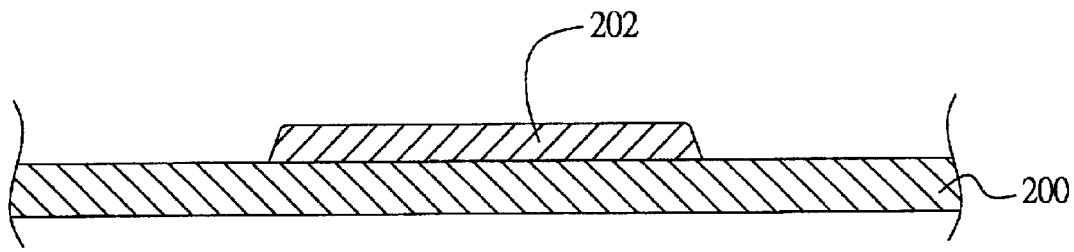
FIGS. 2a–2e illustrate, in cross-sectional view, the major steps of fabricating a TFT panel according to one embodiment of the present invention.

The method for manufacturing a TFT panel according to the present invention will now be described with reference to FIGS. 2a–2e. First, a first metal layer is formed by sputtering on an insulating substrate 200 such as a transparent glass substrate to a predetermined thickness. As shown in FIG. 2a, the first metal layer is patterned by a first photolithography process to form a first metal pattern including a gate line with a gate electrode 202 on the substrate 200.

Figure 2B:
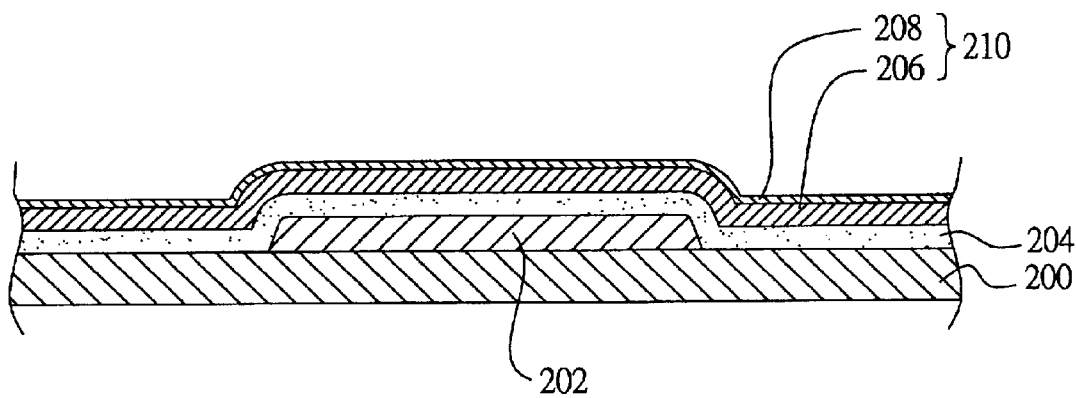

Next, as shown in FIG. 2b, an oxide, silicon nitride or silicon oxynitride layer is deposited over the-entire surface of the substrate 200 having the gate line and the gate electrode 202 disposed thereon to form a gate insulating layer 204. Then, a semiconductor layer 210 comprising a composite of two amorphous silicon (a-Si) layers is provided on the gate insulating layer 204. In this embodiment, the composite semiconductor layer preferably comprises an amorphous silicon layer 206 and an impurity-doped amorphous silicon layer 208 (e.g., an n+ amorphous silicon layer) which sequentially deposited on the gate insulation layer 202.

Figure 2C:
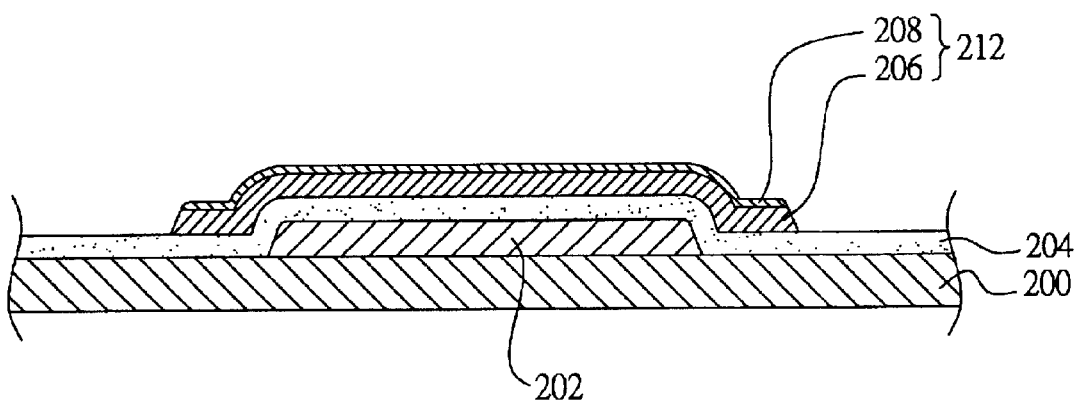

Thereafter, as shown in FIG. 2c, the amorphous semiconductor layer 210 is patterned by a second photolithography process to form a semiconductor layer pattern 212 on the TFT portion of the TFT panel.

Figure 2D:
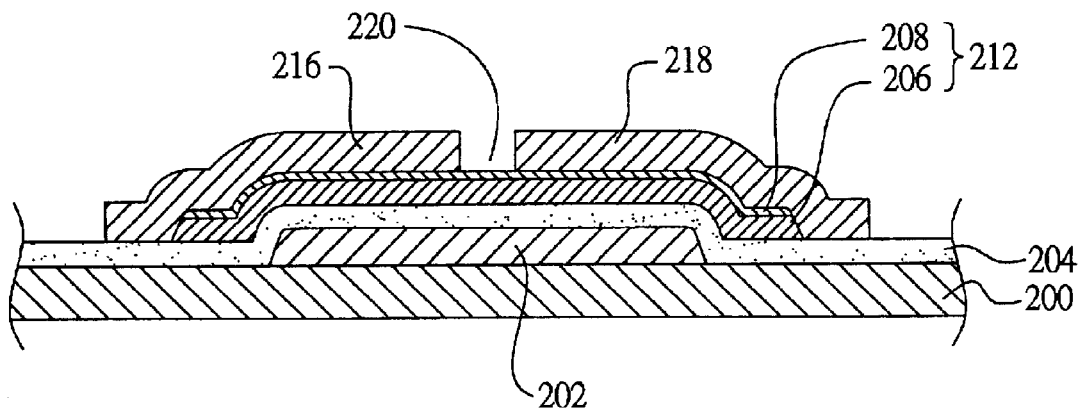

Then, a second metal layer is formed, for example by sputtering on the entire surface of the insulation layer 204 and the amorphous semiconductor pattern 212 to a predetermined thickness. As shown in FIG. 2d, the conductive layer is then patterned by a third photolithography process to form a conductive pattern 214 including a data line (not shown), a source electrode 216 and a drain electrode 218, wherein the source electrode 216 and the drain electrode 218 are separated by the channel region 220. The impurity-doped layer 208 has a portion 222 located in the channel region 220 and exposed through the conductive pattern 214.

Figure 2E:
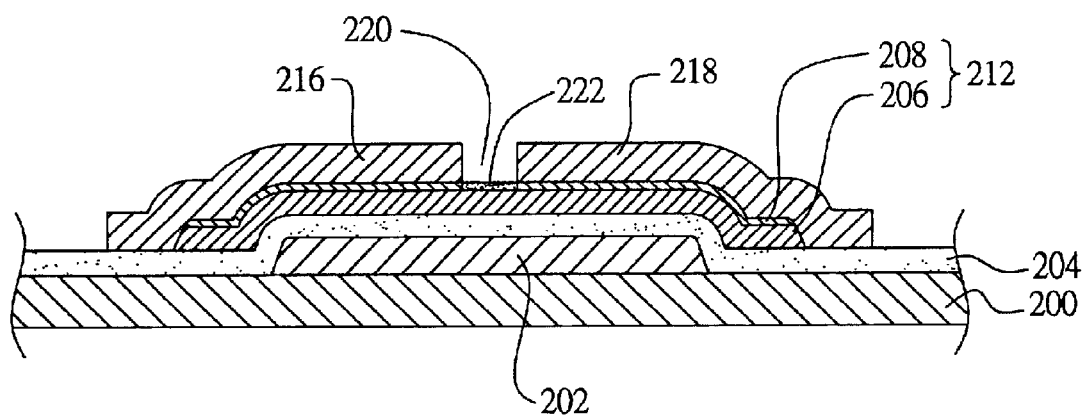

Referring to FIG. 2e, the exposed portion 222 of the impurity-doped layer 208 in the are channel region 220 is treated by an insulating step thereby significantly degrading the conductivity of the exposed portion 222.

The insulating step of the present invention may be conducted by an oxidizing process, a nitridizing process, or a p+ impurity doping process. The oxidizing process may be conducted by $O_3$ treatment, ultraviolet (UV) radiation, atmosphere plasma, or $O_2$ ashing. Specifically, the oxidizing process may be conducted by exposing the portion 222 of the impurity-doped layer 208 to ozone ($O_3$) or intense UV radiation provided by UV light bulbs. In another embodiment of the present invention, the oxidizing process may be conducted by exposing the portion 222 of the impurity-doped layer 208 to a plasma using oxygen gas in a chamber. In still another embodiment of the present invention, the oxidizing process may be conducted by exposing the portion 222 of the impurity-doped layer 208 to a plasma using oxygen gas in an ashing unit. When the insulating step of the present invention is conducted by the oxidizing processes mentioned above, the residual photoresist formed in the third photolithography process can be removed in the same oxidizing process thereby further skipping the conventional photoresist stripping step.

The nitridizing process may be conducted by exposing the portion 222 of the impurity-doped layer 208 to an atmosphere of plasma using ammonium gas. The p+ impurity doping process may be conducted by implanting trivalent impurities such as boron (B), aluminum (Al) or gallium (Ga) to the portion 222 of the impurity-doped layer 208.

Thereafter, a passivation layer (not shown, e.g., SiNx layer) is formed on the entire surface of the above structure to a predetermined thickness. The passivation layer is then patterned to expose parts of the drain electrode 218 in a fourth photolithography process. After forming an indium-tin-oxide (ITO) layer as a transparent conductive layer on the entire surface of the structure having the passivation layer pattern thereon, the ITO layer is patterned by a fifth photolithography process thereby obtaining the TFT panel of the present invention.

In the manufacturing method of a thin film transistor panel of the present invention, the insulating steps described above can significantly degrades the conductivity of the exposed portion of the impurity doped layer. Therefore, the electrons in the impurity-doped layer between the source and drain electrodes can hardly be mobilized thereby overcoming or, at least, reducing the channel leakage problems.

In addition, by eliminating the poisonous gas typically required by the conventional back etching process, the TFT panel manufacturing process of the present invention results in very large reductions in the volume of the poisonous gas which must be purchased, managed and disposed of in the user's waste stream. The user can thus anticipate dramatic savings in operating costs arising from the elimination of no-longer-required poisonous gas. Furthermore, since no poisonous gas is involved in the aforementioned insulating step, the insulating step of the present invention can be achieved by a simple apparatus with low cost in comparison with the conventional back etching process using $Cl_2/SF_6$ gases.

Although the invention has been explained in relation to its preferred embodiment, it is to be understood that many other possible variations can be made without departing from the spirit and scope of the invention as hereinafter claimed.

What is claimed is:

1. A method of manufacturing a thin film transistor panel, said method comprising the steps of:

forming a gate line with a gate electrode connected to the gate line on an insulating substrate;

depositing a gate insulating layer covering the gate line;

forming a semiconductor layer comprising an impurity-doped layer on the gate insulating layer;

patterning the semiconductor layer;

forming a conductive patterned layer on the patterned semiconductor layer, the conductive pattern layer comprising a source electrode a drain electrode and a channel region, disposed between the source electrode and the drain electrode wherein the impurity doped layer has a portion located in the channel region and exposed through the conductive pattern layer; and insulating the exposed portion of the impurity doped layer;

wherein the impurity doped layer is an n+ amorphous silicon layer, and wherein the insulating step is conducted by a p+ impurity doping process.

2. A method of manufacturing a thin film transistor panel, said method comprising the steps of:

forming a gate line and a gate electrode connected to the gate line on an insulating substrate;

forming a gate insulating layer covering the gate line;

forming an amorphous layer and an impurity doped layer on the gate insulating layer;

patterning the amorphous layer and the impurity doped layer;

forming a source electrode and a drain electrode on the patterned impurity doped layer wherein the patterned impurity doped layer has a first portion located under the source electrode, a second portion located under the drain electrode, and a third portion between the source electrode and the drain electrode; and conducting an insulating step to significantly degrade the conductivity of the third portion of the patterned impurity doped layer while leaving the first and second portions of the impurity doped layer unaffected in said insulating steps;

wherein the impurity doped layer is an n+ amorphous silicon layer; and wherein the insulating step is conducted by a p+ impurity doping process.

3. The method as claimed in claim 2, wherein the conductivity of the third portion of the impurity doped layer is degraded in said insulating step such that the first portion of the impurity doped layer is electrically isolated from the second portion of the impurity doped layer.

4. The method of claim 2, wherein said insulating step is a step of treating the third portion of the patterned impurity-doped layer to reduce the conductivity of said third portion without physically removing said third portion.

* * * * *